United States Patent
Cullum et al.

(10) Patent No.: US 6,188,974 B1
(45) Date of Patent: Feb. 13, 2001

(54) METHOD FOR CONSTRUCTING REDUCED-ORDER MODELS OF SYSTEMS

(75) Inventors: Jane Grace Kehoe Cullum, Yorktown Heights; Albert Emil Ruehli, Chappaqua, both of NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/046,229

(22) Filed: Mar. 23, 1998

(51) Int. Cl.$^7$ .............................. G06G 7/19; G06F 17/50
(52) U.S. Cl. .................................. 703/14; 703/13; 703/2
(58) Field of Search ......................... 703/13, 14

(56) References Cited

U.S. PATENT DOCUMENTS

| | | | |
|---|---|---|---|
| 5,537,329 | * | 7/1996 | Feldmann et al. ...................... 703/14 |
| 5,751,591 | * | 5/1998 | Asada ..................................... 703/14 |
| 5,826,215 | * | 10/1998 | Garrett et al. .......................... 703/14 |
| 5,920,484 | * | 7/1999 | Nguyen .................................. 703/14 |

OTHER PUBLICATIONS

"Inductance Calculations using Partial Inductances and Macromodels", Ruehli et al., IEEE 1995.*
"Circuit Models for Three Dimensional Geometrices Including Dielectrics", Reuhli et al., IEEE Tansactions on Microwave and Techniques, v40, No. 7, Jul. 1992, IEEE 1992.*
"Three Dimensional Circuit Oriented Electromagnetic Modeling for VLSI Interconnects", Heeb et al., IEEE 1992.*
"FastPep: A Fast Parasitic Extraction Program for Complex Three Dimensional Geometries", Kamon et al., IEEE 1997.*
"Comparison of Differential and Common Mode Response for Short Transmission Line Using PEEC Models", Ruehli et al., IEEE 1996.*
"Three Dimensional Interconnect Analysis using Partial Element Equivalent Circuits", Heeb et al., IEEE Transactions on Circuits and Systems, v39, No. 11, Nov. 1992, IEEE 1992.*
"Stable Time Domain Solutions for EMC Problems using PEEC Circuit Models", Rehli et al., IEEE 1994.*
"Hybrid Electromagnetic Modeling of Noise Interactions in Packaged Electronics Based onPartial Element Equivalent Circuit Formulation", Pinello et al., IEEE Transactions, IEEE 1997.*
"Using Partial Element Equivalent Circuits Full Wave Analysis and Pade Via Lanczos to Numberically Simulate EMC Problems", Slone et al., IEEE 1997.*
"Partial Element Equivalent Circuit (PEEC) Method and its Application in the Frequency and Time Domain", Ruehli, IEEE 1996.*

* cited by examiner

*Primary Examiner*—Kevin J. Teska
*Assistant Examiner*—William Thomson
(74) *Attorney, Agent, or Firm*—McGinn & Gibb, P.C.; Stephen C. Kaufman, Esq.

(57) ABSTRACT

A method comprising a computational procedure for obtaining reduced-order models of partial element equivalent circuit (PEEC) models of very large scale integrated (VLSI) interconnects. The methodology is not limited to PEEC applications, and can be used for generating reduced-order models of other systems which can be modeled with linear, time-invariant systems of ordinary differential equations with time delays.

18 Claims, 6 Drawing Sheets

Real(H(jw)): cpatch: true= "b-" TrueResponse o/i case 1= "m-" diff= "g-"

Image(H(jw)): cpatch: true= "b-" TrueResponse o/i case 1= "m-" diff= "g-"

3Bars: 25Cells/Bar: rho/t=.34x10$^{-5}$: w=.01; l=25.4; vl2-vl3; 2x7y boxes: [-5,2]x[0,70]

Real(H(jw)): cpatch: true= "b-" One Sided Arnoldi o/i case 1="m-" diff= "g-"

Image(H(jw)): cpatch: true= "b-" One Sided Arnoldi o/i case 1= "m-" diff= "g-"

3Bars: 25Cell/Bar: rho/t=.34x10$^{-5}$: w=.01;l=25.4; vl2-vl3; 2x7y boxes: [-5,2]x[0,70]

3Bars: 25Cells/Bar: rho/t=.34x10$^{-5}$: w=.01; l=25.4; vr2-vr3; 2x7y boxes: [-5,2]x[0,70]

3Bars: 25Cells/Bar: rho/t=.34x10$^{-5}$; w=.01; l=25.4; vr2-vr3; 2x7y boxes: [-5,2]x[0,70]

METHOD FOR CONSTRUCTING REDUCED-ORDER MODELS OF SYSTEMS

FIELD OF THE INVENTION

This invention relates to a novel method for creating reduced-order models of various types of physical systems describable as linear circuit models with time delays.

INTRODUCTION OF THE INVENTION

Our motivation and methodology for the present invention are informed by an illustrative situation which centers on models for VLSI interconnects. High density circuit layouts and decreasing clock cycle times have amplified the effects of interconnect time delays and electromagnetic coupling in packaged electronic circuits, exacerbating the possibilities for signal delays and distortion. Simulation software for analyzing the performance of circuit packages requires reduced-order models of well-chosen subsets of the circuits in the package. PEEC models for the VLSI interconnects in the package are formulated as linear circuit models with time delays and comprise one large subset which requires model reduction.

SUMMARY OF THE INVENTION

With respect to the aforementioned package simulation models, it is necessary to create reduced-order models of the VLSI interconnects.

In high density layouts with very fast clock cycle times, models for VLSI interconnects must include the effects of the wire travel time and of the electromagnetic coupling between wires. Partial Element Equivalent Circuit (PEEC) models which are based upon integral formulations of Maxwell's equations and which are expressed as equivalent circuit formulations consist of linear systems of ordinary differential equations with multiple time delays. These delays occur in both state variables and derivatives of state variables. Tools are needed for systematic model reduction of these types of models.

We point out, by way of contrast and apposition, that the prior art has not adequately addressed this problem, and does not articulate a systematic method for generating reduced-order models of VLSI interconnects which include the effects of electromagnetic coupling and wire lengths. That is, to an extent the prior art may somehow intersect with the situation outlined above, it must inherently respond to it by recourse to unsatisfactory ad hoc or heuristic expedients.

We have now discovered a novel method for creating reduced-order models of PEEC models for VLSI interconnects. This method is equally applicable to other physical systems describable by time-invariant, linear systems of ordinary delay-differential equations. In this way, we advantageously solve the problem presented above, and fulfill an important need.

The method comprises the steps of:
a) representing an original physical system comprising time delays as an original linear circuit model;
b) transforming the original linear circuit model into a corresponding original transform domain circuit model;
c) locally approximating the original transform domain circuit model by a system without time delays, thereby generating at least one localized representation of the original system;
d) applying an iterative method to each localized representation of the original system, for identifying local characteristics of the original system; and
e) combining the identified local characteristics to obtain a reduced-order model for the original system.

DETAILED DESCRIPTION OF THE DRAWINGS

The invention is illustrated in the accompanying drawings, in which.

Figure 2:
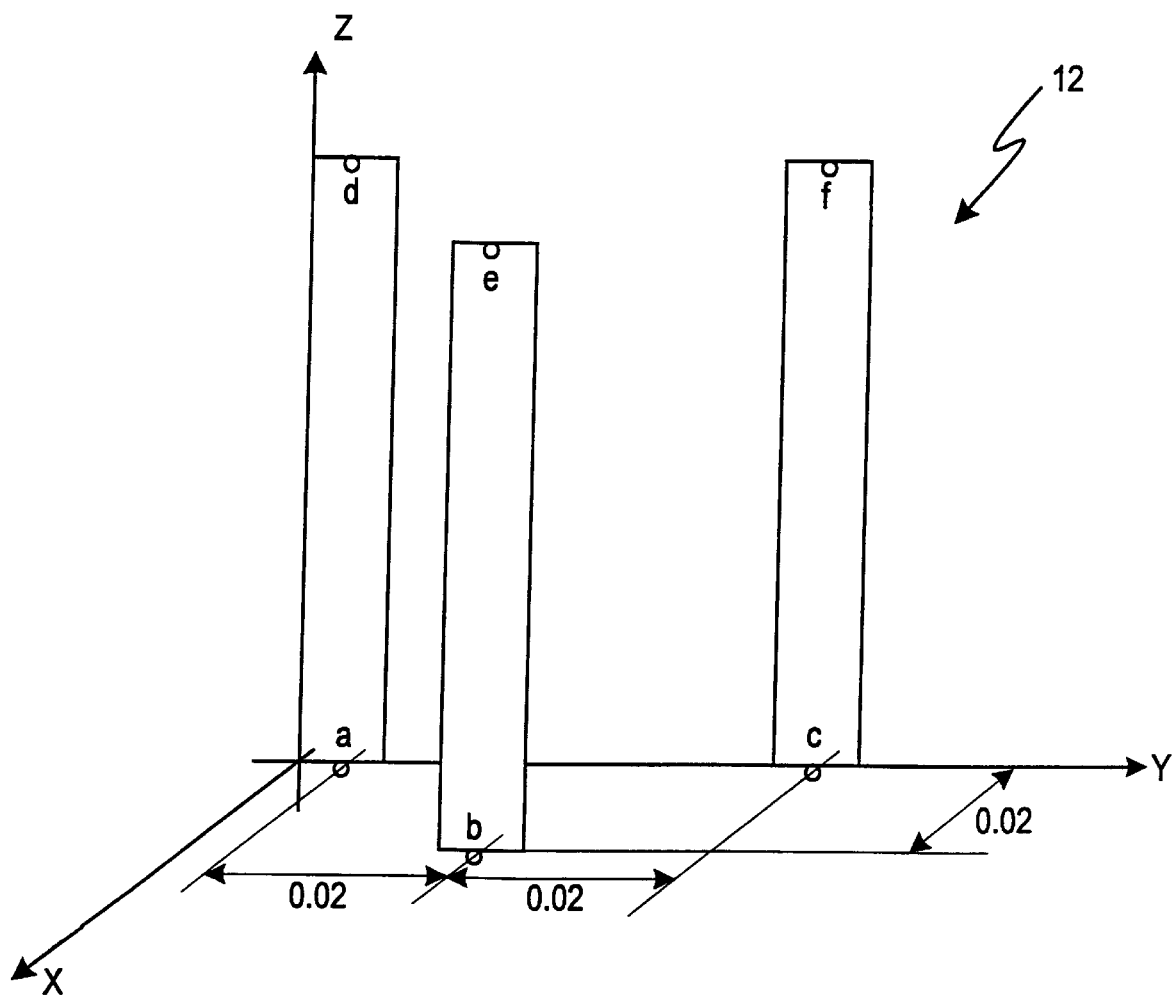
FIG. 2 is a schematic of Example 1, a VLSI interconnect with three wires.
Figure 5A:
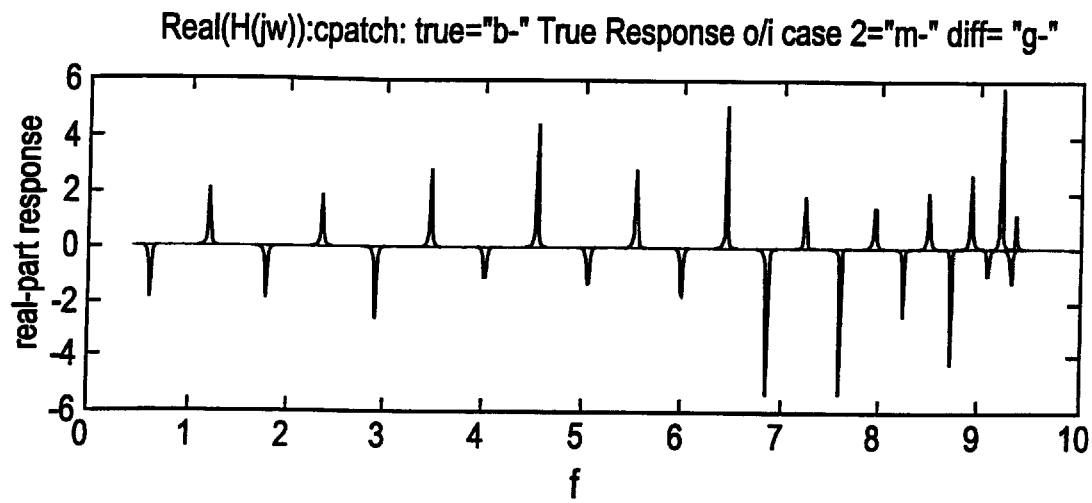
Figure 5B:
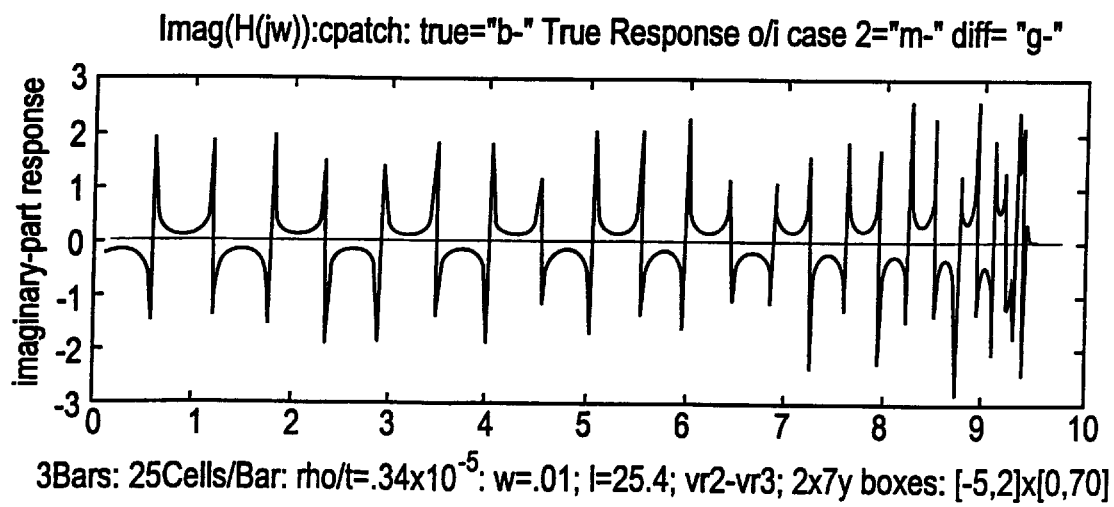
Figure 6A:
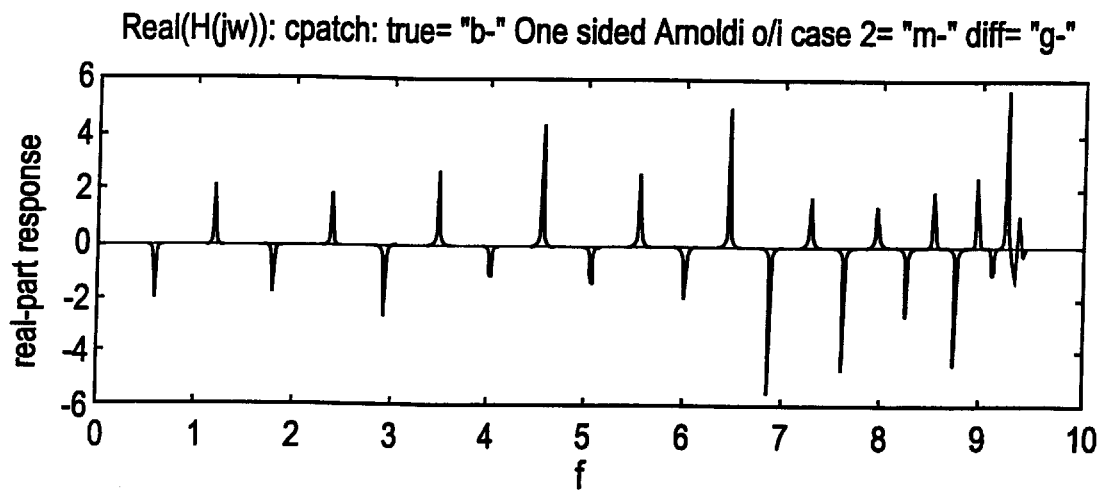
Figure 6B:
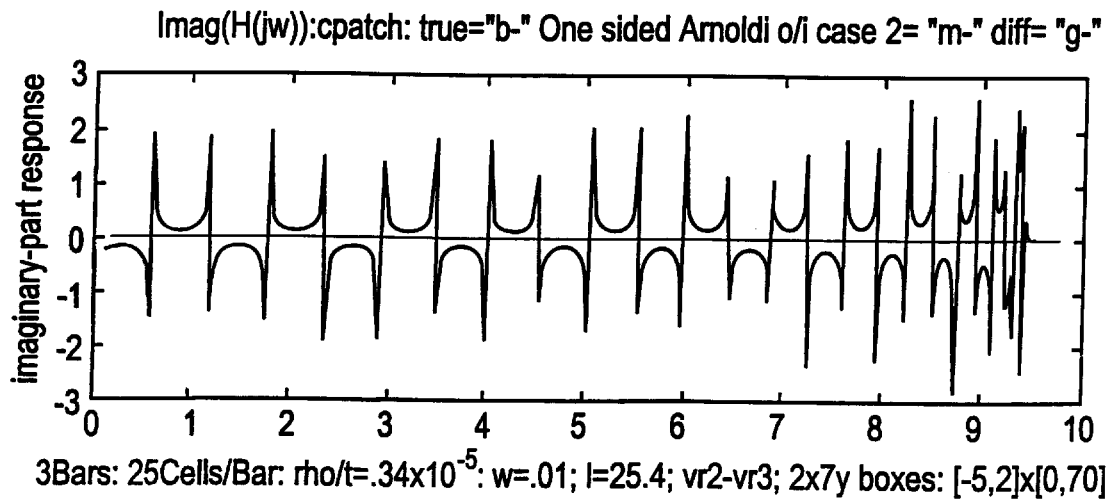

FIGS. 5a and 5b are plots of the real and the imaginary parts of the transfer function for Example 1 corresponding to applying equal and opposite source current inputs at points A and B in FIG. 2 and measuring the output, the difference in the voltages at points E and F in FIG. 2; and FIGS. 6a and 6b are plots of the real and of the imaginary parts of the reduced-order transfer function corresponding to the transfer function in FIG. 5 which was obtained using the method described in section 5.

DETAILED DESCRIPTION OF THE INVENTION

The detailed description of the invention proceeds as follows. In section 1 we set forth the notation. In section 2 we review briefly PEEC formulations and give a schematic diagram and corresponding relationships for a simple PEEC example. In section 6 we use a larger version of this model to illustrate the proposed method. To motivate the invention, in section 3 we consider systems described by ordinary differential equations with no time delays.

In section 4 we extend the discussion in section 3 to problems describable by linear time invariant systems of delay-differential equations. In section 5 we define a reduced-order modeling procedure for linear, time-invariant systems of delay-differential equations. The power of this approach is demonstrated in section 6 where we apply this procedure to Example 1 in FIG. 2, numeral 12. We use the following notation and definitions.

1 Notation $A=(a_{ij})$, $1 \leq i,j \leq n$, n×n matrix $A(s)$=n×n matrix which is a function of parameter s $\det(A(s))$, determinant of $A(s)$, s, point in complex plane $I_j$, j×j identity matrix si/so, single input, single output system mi/mo, multiple input and/or multiple output system

2 Partial Element Equivalent (PEEC) Circuits

Electromagnetic fields and time delays in VLSI interconnects may distort and delay circuit signals. In high density packages with high frequency clocks, two-dimensional transverse electromagnetic wave (TEM) models are not sufficient to characterize this behavior and it is necessary to work with full wave, three-dimensional models.

PEEC models are obtained by appropriate discretizations of boundary integral formulations of Maxwell's equations which describe the electric and the magnetic field at any point in any conductor. The discretization is chosen to enable the generation of equivalent circuit models which are compatible with existing circuit simulators. Approximations to the current, charge, and the potential (voltage) variables are obtained. Charges are assumed to be located on the conductor surfaces. Each conductor is subdivided into cells. Self and partial inductances and capacitances within and between the cells and between the wires are introduced. Time delays which correspond to the free space travel times between nodal points defined by the discretization are included in the model. The continuity equation which connects the charge and the current variables in Maxwell's equations is replaced by some forms of Kirchoff's laws applied to the resulting equivalent circuits.

Figure 1A:
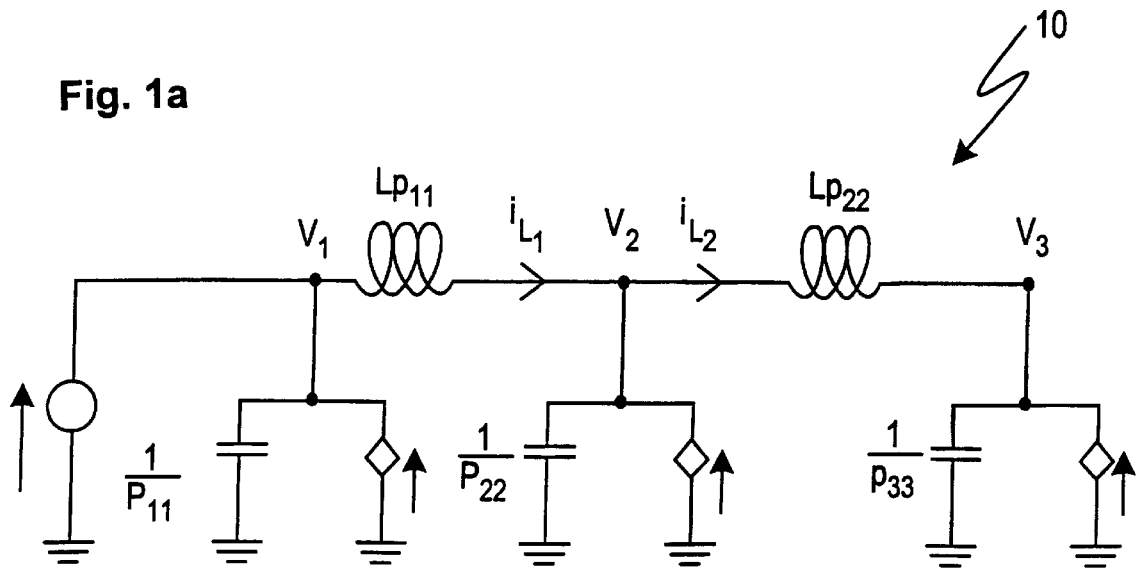
FIGS. 1a and 1b are circuit diagrams for a VLSI Interconnect PEEC circuit comprising two wires, two inductive cells in each wire.
Figure 1B:
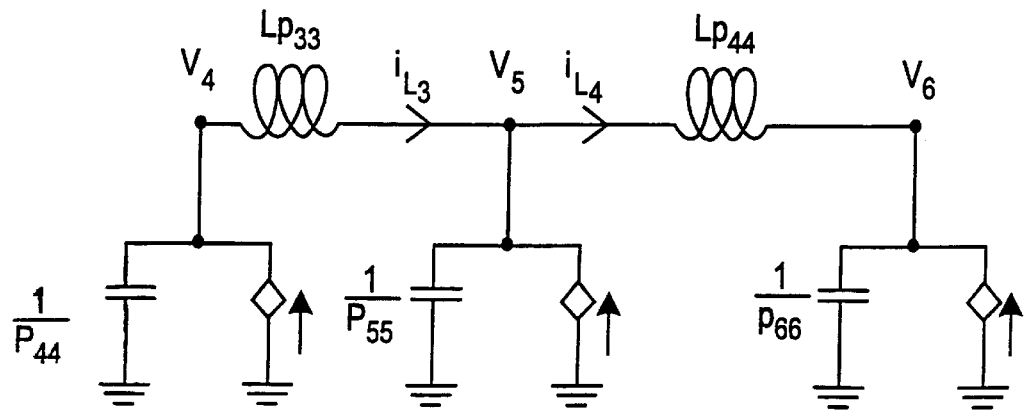

FIG. 1, numeral 10, is a schematic of a simple, two wire—two cells per wire configuration. For the self inductance specifications, each wire has been divided into two equal size cells. For the self capacitance definitions it is redivided into one full capacitance cell and two boundary half-size cells.

In FIG. 1, the parameters $p_{jj}$, $1 \leq j \leq 6$, denote the self capacitances of the three full or half capacitance cells in each wire. The self inductances of each inductance cells are denoted by the parameters $Lp_{kk}$, $1 \leq k \leq 4$. The effects of the mutual capacitances are expressed as current sources in parallel with the self capacitances. The effects of the mutual inductances are not visible in the schematic. They are introduced by adding voltage drop terms corresponding to each mutual inductance and the matching inductance current.

We use $p_{ij}$, $i \neq j$, $1 \leq i, j \leq 6$, to denote the partial (mutual) capacitances between capacitance cells which are in the same or different wires and $Lp_{km}$, $k \neq m$, $1 \leq k, m \leq 4$, to denote mutual inductances between inductance cells which are in the same or different wires. The corresponding system of delay-differential equations is formulated in terms of the nodal voltages $V_j$, $j = 1, \ldots, 6$ and the inductance currents $i_{L_k}$, $k = 1, \ldots, 4$. Therefore, the final PEEC model for FIG. 1 has size n=10 where the unknowns are $[V_1, V_2, V_3, V_4, V_5, V_6, i_{L_1}, i_{L_2}, i_{L_3}, i_{L_4}]^T$.

In this invention we focus on frequency domain formulations of PEEC models. The Laplace transform A(s) of the system matrix for a PEEC model for the circuit in FIG. 1 is given in Equation(1) where we have used the equivalences defined in Table 1. The equations are constructed using a condensed modified nodal analysis approach.

TABLE 1

Notation used in Equations(1).

$$A_0(s) = \begin{bmatrix} -1 & 1 & 0 & 0 & 0 & 0 & sl_1 & sl_{12}^{rL} & sl_{13}^{rL} & sl_{14}^{rL} \\ sp_1 & 0 & 0 & 0 & 0 & 0 & 1p_{12}^{rP} & dp_{12,13}^{rP} & dp_{14,15}^{rP} & dp_{15,16}^{rP} \\ 0 & sp_2 & 0 & 0 & 0 & 0 & -1p_{21}^{rP} & 1p_{23}^{rP} & dp_{24,25}^{rP} & dp_{25,26}^{rP} \\ 0 & -1 & 1 & 0 & 0 & 0 & sl_{21}^{rL} & sl_2 & sl_{23}^{rL} & sl_{24}^{rL} \\ 0 & 0 & sp_3 & 0 & 0 & 0 & dp_{31,32}^{rP} & -1p_{32}^{rP} & dp_{34,35}^{rP} & dp_{35,36}^{rP} \\ 0 & 0 & 0 & -1 & 1 & 0 & sl_{31}^{rL} & sl_{32}^{rL} & sl_3 & sl_{34}^{rL} \\ 0 & 0 & 0 & sp_4 & 0 & 0 & dp_{41,42}^{rP} & dp_{42,43}^{rP} & 1p_{45}^{rP} & dp_{45,46}^{rP} \\ 0 & 0 & 0 & 0 & sp_5 & 0 & dp_{51,52}^{rP} & dp_{52,53}^{rP} & -1p_{54}^{rP} & 1p_{56}^{rP} \\ 0 & 0 & 0 & 0 & -1 & 1 & sl_{41}^{rL} & sl_{42}^{rL} & sl_{43}^{rL} & sl_4 \\ 0 & 0 & 0 & 0 & 0 & sp_6 & dp_{61,62}^{rP} & dp_{62,63}^{rP} & dp_{64,65}^{rP} & -1p_{65}^{rP} \end{bmatrix} \quad (1)$$

| Notation | Expanded Equivalent |
|---|---|
| $sp_j$ | $s/P(j, j)$ |
| $sl_j$ | $sLp(j, j)$ |
| $sl_{ij}^{rL}$ | $sLp(i, j)e^{-sDL(i,j)}$ |
| $dp_{ij,ij+1}^{rP}$ | $(P(i, j)/P(i, i))e^{-sDP(i,j)} - (P(i, j+1)/P(i, i))e^{-sDP(i,j+1)}$ |
| $1p_{ij}^{rP}$ | $1 - (P(i, j)/P(i, i))e^{-sDP(i,j)}$ |

In Table 1, P, $L_p$, DP, DL denote respectively, the matrices of capacitance, inductance, capacitance time delay, and inductance time delay. Columns 1–6 in $A_0(s)$ correspond to nodal voltages, and columns 7–10 correspond to inductance currents. We observe that $A_0(s)$ is not sparse. Columns corresponding to inductive currents are full because we have assumed complete coupling of the fields between all of the cells. If all of the time delays are set to zero, then the resulting matrix would have the same nonzero form as $A_0(s)$ with all exponential terms set to 1.

The time delay matrices are constructed by dividing the centroid distances between appropriate cell nodes by the speed of light. For typical PEEC models there are many different time delays and these delays are not negligible or even small. Furthermore, from Equation(1) it is apparent that these delays are associated with both state variables and derivatives of state variables. Therefore PEEC models do not possess any special properties which might simplify the analysis.

3 PEEC Models with Zero Time Delays

To provide motivation and to make the discussion self-contained, we first consider models with no time delays. In section 4 we extend these ideas to systems with time delays. We can analyze any linear, time invariant system described by ordinary differential equations by analyzing the corresponding frequency domain transfer function. The poles of the transfer function characterize the stability of the system.

Consider any physical system described by a linear, time invariant first order system of ordinary differential equations, $$C\dot{\chi} = G\chi + Bu,$$
$$y = E\chi, \quad (2)$$

The matrices C and G are n×n where n is the order of the system. B is n×q where q is the number of input variables, and E is o×n where o is the number of output variables. The transfer function H(s) satisfies $$y(s)/u(s)=H(s)=E(sC-G)^{-1}B. \tag{3}$$

If q=o=1, H(s) is a rational function of s. In general, H(s) is an o×q matrix whose entries are the si/so transfer functions for each possible input and output pair. We can express H(s) in terms of the poles and the residues of the system.

$$H(s)=\sum_{j=1}^{J} R_j/(s-p_j) \tag{4}$$

where the residues, $R_j$, are o×q matrices, and $p_j$ are the system poles.

Poles, the natural frequencies of the system, correspond to solutions of equation(2) with u=0.

If we define A(s)=sC−G, then poles are values of s such that A(s)χ=0 for some nontrivial x, $$\det A(s)=0, \text{ or equivalently } G\chi=sC\chi. \tag{5}$$

Given any point $s_0$, for s=$s_0$+σ, we can rewrite equation(3) as $$H(s)=\tilde{H}(\sigma)=E(I+\sigma F)^{-1}K$$

where $$F=(s_0 C-G)^{-1}C$$

and $$K=(s_0 C-G)^{-1}B. \tag{6}$$

For large linear circuits with no time delays, variants of iterative Lanczos and Arnoldi methods can be applied to the matrix F in equation(6) to obtain matrices $T_j$, j=2, . . . which together with the corresponding Lanczos or Arnoldi vectors yield information about F. These matrices can be used to obtain approximations to transfer functions of the original system in equation(3).

4 PEEC Models with Time Delays

Consider a physical system described by a time invariant linear system of ordinary differential equations with time delays. The PEEC models considered in this invention have the following time domain formulation.

$$C\dot{x}(t)+\sum_{k,m=1}^{M}\tilde{C}_{k,m}\dot{x}(t-\tau_{k,m}^{L})=Gx(t)+\sum_{i,j=1}^{J}\tilde{G}_{i,j}x(t-\tau_{i,j}^{P})+Bu(t) \tag{7}$$

$$y=Ex(t).$$

Each matrix C, $C_{k,m}$ and G, $G_{i,j}$ is n×n where n is the order of the system. B is n×q where q is the number of input variables, and E is o×n where o is the number of output variables. We note, moreover that the procedure described in section 5 is not specific to this particular description. The corresponding transfer function H(s) is defined by equation (8).

$$y(s)/u(s)=H(s)=E(s)(A(s))^{-1}B(s) \text{ where} \tag{8}$$

$$A(s)=sC+\sum_{k,m=1}^{M}C_{k,m}(s)-G-\sum_{i,j=1}^{J}G_{i,j}(s),$$

$$B(s)=B \text{ and } E(s)=E.$$

H(s) is a matrix of rational functions of transcendental functions of s. As in the zero time delay case, the poles of the transfer junction are the values of s such that $$\det A(s)=0. \tag{9}$$

However, equation(9) is transcendental in s and there are an infinite number of poles.

The model reduction procedures for linear systems with no time delays which are based upon Arnoldi and Lanczos recursions require a fixed system matrix F. A fixed matrix can be obtained only if the transform of the original system can be expressed linearly in s. Transforms of systems with time delays are transcendental in s. Therefore, these methods are not directly applicable to systems with time delays.

5 Method for constructing reduced-order models of PEEC systems

We want to be able to incorporate very large interconnect models into VLSI circuit simulations. We will do this by constructing reduced-order models for PEEC models of the interconnects and then connecting these models together with reduced-order models for other portions of the circuits.

In this section we describe a tool which can be used to generate reduced-order models of large PEEC circuits. This procedure, however, is not specific to this application and can be used on other problems described by linear systems of time-invariant, ordinary delay-differential equations with transfer functions expressed as in equation(8).

Model Reduction Procedure for Systems with Time Delays

1. Specify a region Ω in the complex s-plane which includes all complex frequencies s of interest in the application.
2. Subdivide Ω into smaller regions $B_j$, for $1 \leq j \leq K$.
3. Do for each region $B_j$, j=1, . . . K,
   (a) Construct a polynomial approximation $Q_j(s)$ to A(s).
   (b) Using $Q_j(s)$, B, E construct a corresponding linear system $L_j$ with no time delays.
   (c) Using an iterative method such as a Lanczos or an Arnoldi method, compute a pole and residue approximation to the transfer function $H^{L_j}(s)$ of $L_j$ for s∈$B_j$.
   (d) Combine the pole and residue information obtained in each $B_j$ to obtain an approximation to the transfer function H(s) of the original system in Ω.

There are no restrictions on the types of time delays. Delays may correspond to state variables or to derivatives of state variables. This procedure can also be used to study the stability of linear, time-invariant systems with time delays as various parameters in the system are modified. In the next section we apply this procedure to Example 1 in FIG. 2.

6 Numerical Tests: PEEC Models

We consider Example 1 in FIG. 2. Each wire in the three wire configuration was of length 25.4 cm, width 0.01 cm, and 0 thickness. Each wire was discretized into 25 cells and small resistors were added in series with each self inductance to simulate the resistance of the wires. The Laplace transform of the corresponding system of 159 linear, time-invariant delay-differential equations was generated. This transform contained terms of the type listed in Table 1.

In selecting a region Ω, we use the fact that there exist physical limits on the system response times. Of particular interest are regions near the imaginary axis. If we set all of the time delays to zero and reduce the resistance to zero, the poles and the zeros of the resulting system would lie on the imaginary axis. We also know that any system poles must occur in conjugate pairs. Therefore, we only need to consider the behavior in a region in the upper half of the complex plane.

We defined Ω=[−5.1, 2]×[−0.1, 70] in the complex plane. We divided this box into 14 boxes of equal size, $B_j$, $1 \leq j \leq 14$.

Each box had width 3.55 and height 10.014. Since we know a priori that s=0 is a pole of the system, we selected the $B_j$ so that s=0 was not an expansion point.

In each $B_j$ we generated a quadratic approximation $Q_j(s)$ to A(s) as follows. We let $s=s_j+\sigma$ and expressed each exp $(-s\tau)$ where $\tau$ is a time delay as $\exp(-s_j\tau)\exp(-\sigma\tau T)$. We then replaced $\exp(-\sigma\tau)$ by $1-\sigma\tau+\sigma^2\tau^2/2$. Combining like powers of $\sigma$ we obtained $Q_j(s_j+\sigma)=M_0^j+M_1^j\sigma+M_2^j\sigma^2$ where $M_0^j, M_1^j, M_2^j$ are the matrices of coefficients corresponding respectively to $\sigma^0, \sigma^1, \sigma^2$.

In $B_j$, we constructed a corresponding linear system, $L_j$, with no time delays as follows.

We defined $$C_0^j = \begin{bmatrix} (M_0^j)^{-1}M_1^j & (M_0^j)^{-1}M_2^j \\ -I & 0 \end{bmatrix}; \quad (10)$$

$$\tilde{B}_j = \left((M_0^j)^{-1}B\right)^T, 0\right)^T; \text{ and } \tilde{E} = (E^T, 0)^T;$$

We used $C_0^j$, $\tilde{B}_j$, and $\tilde{E}_j$ to define the following transform of a linearized system $L_j$.

$$z+\sigma C_0^j z = \tilde{B}_j u$$

$$y = \tilde{E} z; \quad (11)$$

The corresponding transfer function $H_j(s)$ of system $L_j$ where $s=s_j+\sigma$ is given in equation(12).

$$H_j(s) = \tilde{E}(I+\sigma C_0^j)^{-1}\tilde{B}_j. \quad (12)$$

Figure 3A:
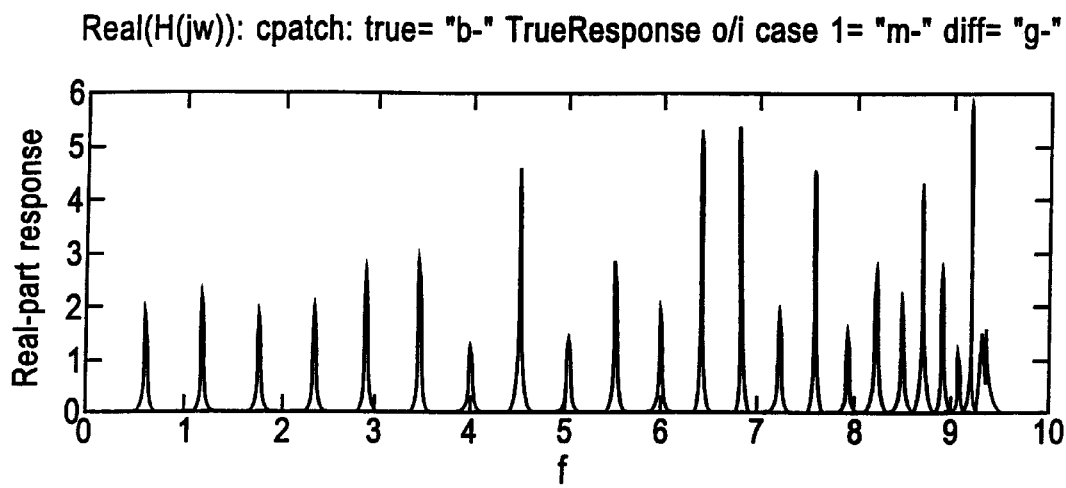
FIGS. 3a and 3b are plots of the real and of the imaginary parts of the transfer function for Example 1 corresponding to applying equal and opposite source current inputs at points A and B in FIG. 2 and measuring the output, the difference in the voltages at points B and C in FIG. 2.
Figure 3B:
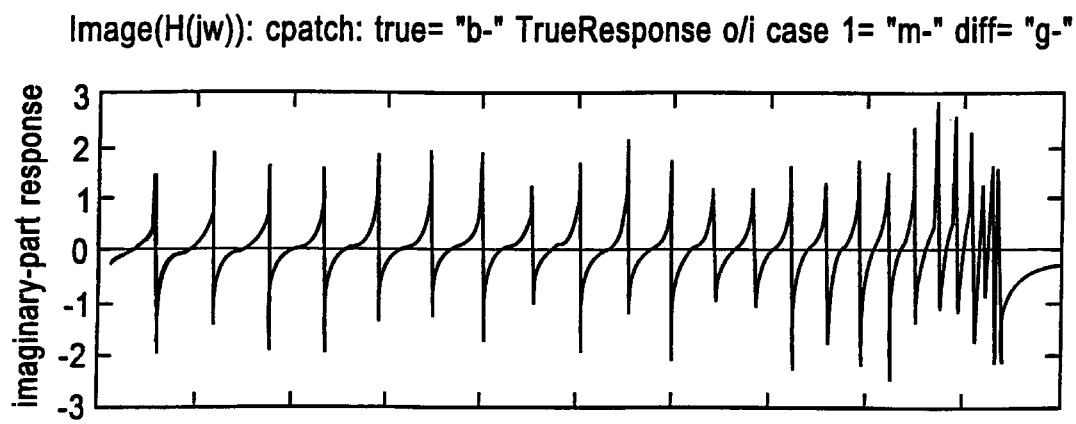

We considered two so/si transfer functions of the original three wire system which we denote by $H^1(s)$ and $H^2(s)$. FIGS. 3 and 5 are plots of the real and of the imaginary parts of $H^1(s)$ and $H^2(s)$.

Both cases corresponded to setting B in the original system equal to the vector which introduces equal and opposite unit source currents at points a and b in FIG. 2. $H^1(s)$ corresponds to the difference in the voltages at points b and c in FIG. 2. $H^2(S)$ corresponds to the difference in the voltages at points e and f in FIG. 2.

In each case, for each $B_j$, an iterative Arnoldi procedure with full reorthogonalization of the Arnoldi vectors was applied to the corresponding system matrix $C_0^j$ with starting vectors $\tilde{B}_j, \tilde{E}_j$. The Arnoldi matrices generated were used to obtain approximations to the poles and the residues of the corresponding transfer functions of each linear system $L_j$ in each $B_j$.

After all $B_j$ were considered, all of the corresponding poles and residues obtained were combined using equation (4) to obtain approximations, $H_{approx}^k(s)$, k=1, 2, to each of the specified $H^k(s)$, k=1,2 for the original system.

Figure 4A:
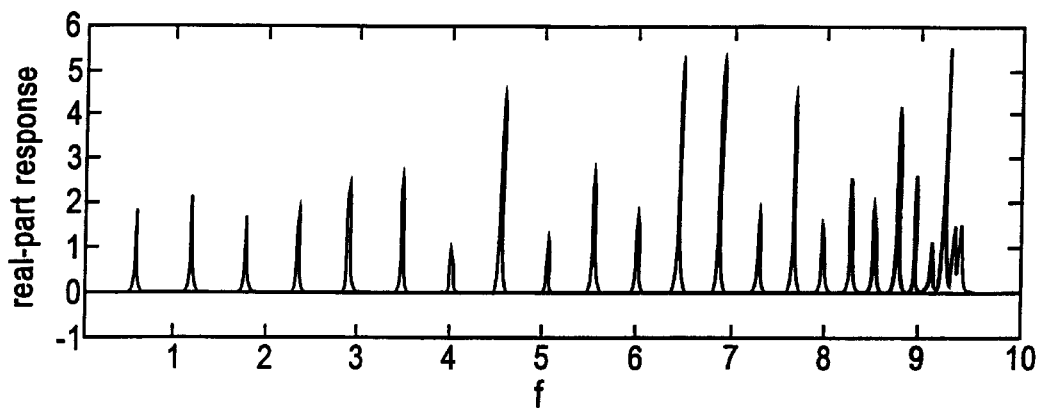
FIGS. 4a and 4b are plots of the real and of the imaginary parts of the reduced-order transfer function corresponding to the transfer function in FIG. 3 which was obtained using the method described in section 5.
Figure 4B:
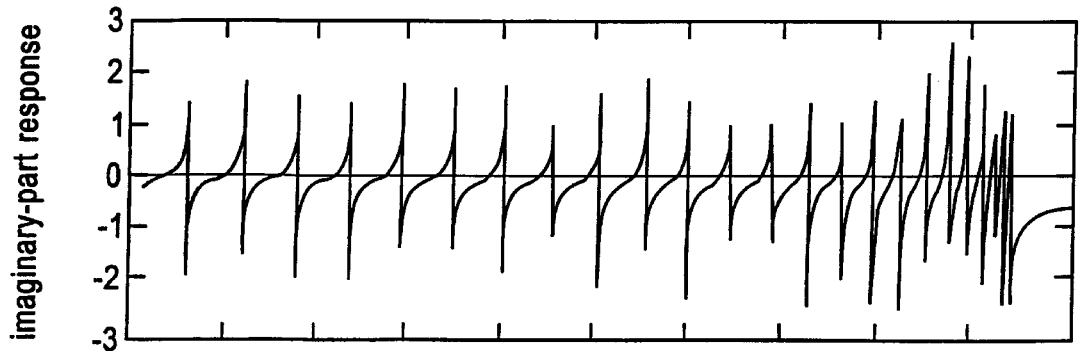

For values of $s=j\omega$, $0 \leq \omega \leq 70$., the real and the imaginary parts of these approximations are plotted in FIG. 4 and FIG. 6. We obtained an excellent match between the approximations generated by the new method and the true values.

7 Summary

We have presented a computational procedure for obtaining reduced-order models of PEEC models of VLSI interconnects. Example 1 in section 6 clearly illustrates the capabilities of this tool. This tool is not specific to PEEC applications, and can be used for generating reduced-order models of other systems which can be modeled using linear, time-invariant systems of ordinary differential equations with or without time delays.

What is claimed:

1. A computer implemented method comprising:
representing an original physical system comprising time delays as an original linear circuit model having a time domain formulation of $$C\dot{x}(t) + \sum_{k,m=1}^{M} \tilde{C}_{k,m}\dot{x}(t-\tau_{k,m}^L) = Gx(t) + \sum_{i,j=1}^{J} \tilde{G}_{i,j}x(t-\tau_{i,j}^P) + Bu(t)$$

$$y = Ex(t)$$

where $C, C_{k,m}$ and $G, G_{i,j}$ are n×n where n is the order of the system, B is n×q where q is the number of variables and E is o×n where o is the number of output variables;

transforming the original linear circuit model into a corresponding original transform domain circuit model having a transfer function represented by the formula $$y(s)/u(s)=H(s)=E(s)(A(s))^{-1}B(s)$$

where $$A(s) = sC + \sum_{k,m=1}^{M} C_{k,m}(s) - G - \sum_{i,j=1}^{J} G_{i,j}(s).$$

B(s)=B and E(s)=E, and H(s) is a matrix of rational functions of s;

locally approximating the original transform circuit model by a system without time delays, thereby generating at least one localized representation of the original system;

applying an iterative method to each localized representation of the original system, for identifying local characteristics of the original system; and combining the identified local characteristics to obtain a reduced order model for the original system.

2. The method according to claim 1, wherein said representing the original physical system comprises representing the physical system as a lumped circuit model.

3. The method according to claim 1, wherein said representing the original physical system comprises representing the physical system so that it comprises lumped and distributed subcomponents.

4. The method according to claim 1, wherein said transforming the original linear circuit comprises transforming the linear circuit model into a corresponding frequency domain circuit model.

5. The method according to claim 4, wherein the corresponding frequency domain circuit model comprises a Laplace transform of the physical system.

6. The method according to claim 1, wherein said locally approximating the original transformed domain circuit model comprises locally approximating the transform of the original system by matrices of polynomials.

7. The method according to claim 1, wherein said applying an iterative method to each localized representation of the original system comprises applying iterative method to linear system formulation of system defined by the matrices of polynomials.

8. The method according to claim 1, wherein said applying an iterative method to each localized representation of the original system comprises computing poles and residues of linear systems obtained from system defined by the matrices of polynomials.

9. The method according to claim 1, wherein said combining the identified local characteristics comprises combining local approximations to the transfer function for each polynomial system into an approximation to the transfer function of the original system.

10. A computer implemented method comprising:

representing an original physical system formed of elements, having time delays as an original linear circuit model having a time domain formulation of $$C\dot{x}(t) + \sum_{k,m=1}^{M} \tilde{C}_{k,m}\dot{x}(t - \tau_{k,m}^L) = Gx(t) + \sum_{i,j=1}^{J} \tilde{G}_{i,j}x(t - \tau_{i,j}^P) + Bu(t)$$

where C, $C_{k,m}$ and G, $G_{i,j}$ are n×n, where n is the order of the system, B is n×q where q is the number of variables and E is o×n where o is the number of output variables;

transforming the original linear circuit model into a corresponding original transform domain circuit model having a transfer function represented by the formula $$y(s)/u(s) = H(s) = E(s)(A(s))^{-1}B(s)$$

where $$A(s) = sC + \sum_{k,m=1}^{M} C_{k,m}(s) - G - \sum_{i,j=1}^{J} G_{i,j}(s).$$

B(s)=B and E(s)=E and H(s) is a matrix of rational functions of s;

locally approximating the original transform circuit model by a system without time delays, thereby generating at least one localized representation of the original system;

applying an iterative method to each localized representation of the original system, for identifying local characteristics of the original physical system; and combining the identified local characteristics to obtain a reduced order model for the original physical system.

11. The method according to claim 10, wherein said representing the original physical system comprises representing the physical system as a lumped circuit model.

12. The method according to claim 10, wherein said representing the original physical system comprises representing the physical system so that it comprises lumped and distributed subcomponents.

13. The method according to claim 10, wherein said transforming the original linear circuit comprises transforming the linear circuit model into a corresponding frequency domain circuit model.

14. The method according to claim 13, wherein the corresponding frequency domain circuit model comprises a Laplace transform of the physical system.

15. The method according to claim 10, wherein said locally approximating the original transformed domain circuit model comprises locally approximating the transform of the original system by matrices of polynomials.

16. The method according to claim 10, wherein said applying an iterative method to each localized representation of the original system comprises applying iterative method to linear system formulation of system defined by the matrices of polynomials.

17. The method according to claim 10, wherein said applying an iterative method to each localized representation of the original system comprises computing poles and residues of linear systems obtained from system defined by the matrices of polynomials.

18. The method according to claim 10, wherein said combining the identified local characteristics comprises combining local approximations to the transfer function for each polynomial system into an approximation to the transfer function of the original system.

* * * * *